(12) United States Patent
Hsieh et al.

(10) Patent No.: US 11,552,071 B2
(45) Date of Patent: Jan. 10, 2023

(54) SEMICONDUCTOR DISCHARGE PROTECTION DEVICE WITH DIODE AND SILICON CONTROLLED RECTIFIER ARRANGEMENTS

(71) Applicant: Littelfuse Semiconductor (Wuxi) Co., Ltd., Wuxi (CN)

(72) Inventors: Ming-Feng Hsieh, Zhubei (TW); Chih-Chun Lin, Zhubei (TW); Zhihao Pan, Shanghai (CN)

(73) Assignee: Littelfuse Semiconductor (Wuxi) Co., Ltd, Wuxi (CN)

( * ) Notice: Subject to any disclaimer, the term of this patent is extended or adjusted under 35 U.S.C. 154(b) by 70 days.

(21) Appl. No.: 16/941,889

(22) Filed: Jul. 29, 2020

(65) Prior Publication Data

US 2021/0035970 A1 Feb. 4, 2021

(30) Foreign Application Priority Data

Jul. 29, 2019 (CN) .......................... 201910692287.1

(51) Int. Cl.
| | |
|---|---|
| *H01L 27/02* | (2006.01) |
| *H01L 21/8222* | (2006.01) |
| *H01L 29/74* | (2006.01) |
| *H01L 27/06* | (2006.01) |

(52) U.S. Cl.
CPC ...... *H01L 27/0248* (2013.01); *H01L 21/8222* (2013.01); *H01L 27/0207* (2013.01); *H01L 27/0292* (2013.01); *H01L 27/067* (2013.01); *H01L 29/7416* (2013.01)

(58) Field of Classification Search
CPC ............ H01L 27/0248; H01L 21/8222; H01L 27/0207; H01L 27/0292; H01L 27/067; H01L 29/7416; H01L 29/0692; H01L 29/87; H01L 27/0262; H01L 27/0255; H01L 21/82; H01L 29/36
See application file for complete search history.

(56) References Cited

U.S. PATENT DOCUMENTS

| | | | |
|---|---|---|---|
| 9,385,115 B2* | 7/2016 | Notermans | ........... H01L 27/067 |
| 10,141,300 B1 | 11/2018 | Mallikarjunaswamy | |
| 10,985,155 B1* | 4/2021 | Lin | ..................... H01L 29/0626 |
| 2009/0212323 A1 | 8/2009 | Liu et al. | |
| 2012/0286321 A1 | 11/2012 | Galy et al. | |
| 2017/0098645 A1 | 4/2017 | Su et al. | |
| 2017/0179110 A1 | 6/2017 | Lee | |

OTHER PUBLICATIONS

Extended European Search Report dated Dec. 14, 2020 for European Patent Application No. 20187998.8.

* cited by examiner

*Primary Examiner* — Shouxiang Hu
(74) *Attorney, Agent, or Firm* — KDB Firm PLLC

(57) ABSTRACT

Aspects of the present disclosure include one or more semiconductor electrostatic discharge protection devices. At least one embodiment includes a semiconductor electrostatic discharge device with one or more fingers divided into two segments with alternating p-diffusion and n-diffusion regions, with each region being associated with at least one of a portion of a diode and/or silicon-controlled rectifier (SCR).

10 Claims, 3 Drawing Sheets

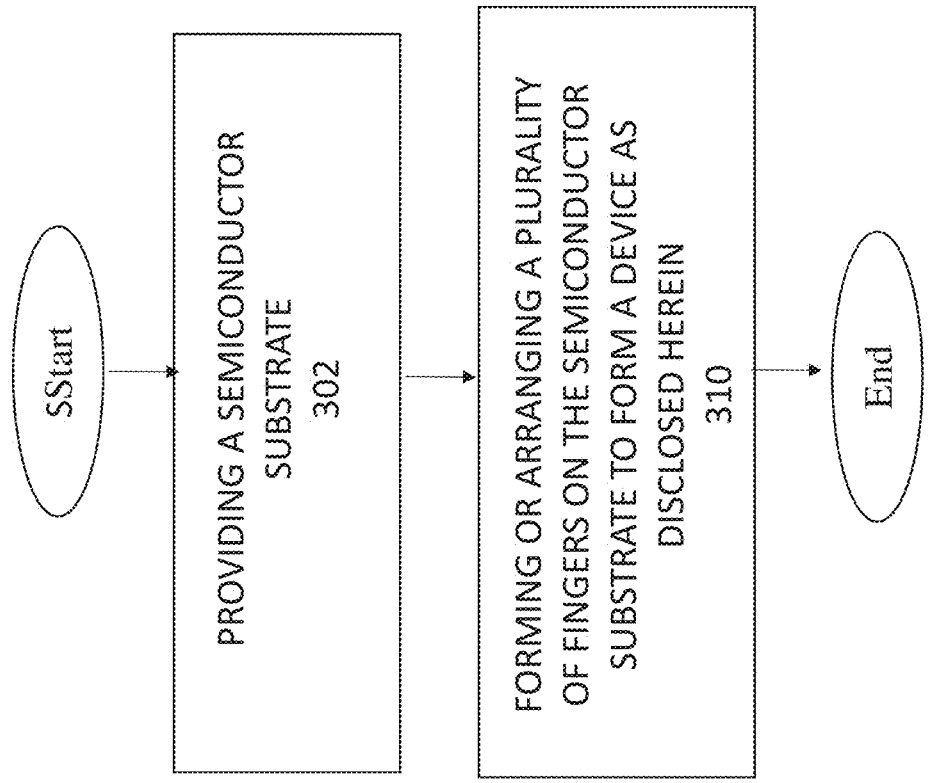

SEMICONDUCTOR DISCHARGE PROTECTION DEVICE WITH DIODE AND SILICON CONTROLLED RECTIFIER ARRANGEMENTS

CROSS REFERENCE TO RELATED APPLICATION

This application claims the benefit of priority to, Chinese Patent Application No. 201910692287.1, filed Jul. 29, 2019, entitled "SEMICONDUCTOR DISCHARGE PROTECTION DEVICE WITH DIODE AND SILICON CONTROLLED RECTIFIER ARRANGEMENTS," which application is incorporated herein by reference in its entirety.

BACKGROUND

Field

Embodiments relate to the field of semiconductor devices, and in particular, electrostatic discharge protection device.

Discussion of Related Art

Electrical surges such as electrical overstress or electrostatic discharge (ESD) transient pulses are common causes of damage to electronic devices. To protect against such transient surges, electronic devices are conventionally protected by surge or ESD protection devices. Such devices provide protection against electrical overstress or electrostatic discharges and are commonly used in portable/consumer electronic devices such as personal computers, audio and video equipment or mobile telephones. Such devices may also be used in data transfer lines or data interfaces used in such portable/consumer electronic devices. According to the International Electrotechnical Commission standard IEC 61000-4-2 (also known as the "gun test") such devices should be protected against system level ESD stresses up to 8 kV.

Original equipment manufacturers (OEMs) of portable/consumer electronic devices have however started to require protection up to 15 kV discharge. To achieve the increased protection levels, ESD devices may simply be made larger. However, larger devices result in increased device capacitance. Portable/consumer electronic devices must be adequately protected from ESD events in accordance with the IEC standards whilst not hampering normal operation of the device. In applications with high speed interfaces such as Universal Serial Bus (USB) or High Definition Multimedia Interface (HDMI) it is necessary that ESD devices have low device capacitance so that signal integrity along the data transfer line or at the data interface is maintained.

In view of the above, the present embodiments are provided.

BRIEF SUMMARY

At least one embodiment includes a semiconductor electrostatic discharge protection device. The electrostatic discharge protection device can include: a plurality of semiconductor controlled rectifiers, and a plurality of diodes, where the plurality of semiconductor rectifiers and the plurality of diodes are integrally arranged into at least two fingers, where each finger includes at least two segments along a surface of a semiconductor surface, where each of the at least two segments and each of the at least two fingers are in an alternating diode-rectifier arrangement with respect to one another.

Another embodiment includes a semiconductor electrostatic discharge protection device. The electrostatic discharge protection device can include: a plurality of semiconductor controlled rectifiers, and a plurality of diodes, where the plurality of semiconductor rectifiers and the plurality of diodes are integrally arranged into at least two fingers, where each finger includes at least two segments along a surface of a semiconductor surface, where each of the at least two segments and each of the at least two fingers are in an alternating diode-rectifier arrangement with respect to one another, where each of the at least two segments is divided by a portion of a diffusion region.

Yet another embodiment includes a semiconductor electrostatic discharge protection device. The electrostatic discharge protection device can include: a plurality of semiconductor controlled rectifiers, and a plurality of diodes, where the plurality of semiconductor rectifiers and the plurality of diodes are integrally arranged into at least two fingers, where each finger includes at least two segments along a surface of a semiconductor surface, where each of the at least two segments and each of the at least two fingers are in an alternating diode-rectifier arrangement with respect to one another, where each of the at least two segments is divided by a portion of a diffusion region, where at least one of the plurality of diodes is a p-n diode.

Yet another embodiment includes a semiconductor electrostatic discharge protection device. The electrostatic discharge protection device can include: a plurality of semiconductor controlled rectifiers, and a plurality of diodes, where the plurality of semiconductor rectifiers and the plurality of diodes are integrally arranged into at least two fingers, where each finger includes at least two segments along a surface of a semiconductor surface, where each of the at least two segments and each of the at least two fingers are in an alternating diode-rectifier arrangement with respect to one another, where at least one of the two fingers includes a p-type well with a first p-type diffusion region and a first n-type diffusion region, and where the first p-type region is staggered and divides the at least one of the two segments into the two portions associated with the at least one of the two fingers.

Yet another embodiment includes a semiconductor electrostatic discharge protection device. The electrostatic discharge protection device can include: a plurality of semiconductor controlled rectifiers, and a plurality of diodes, where the plurality of semiconductor rectifiers and the plurality of diodes are integrally arranged into at least two fingers, where each finger includes at least two segments along a surface of a semiconductor surface, where each of the at least two segments and each of the at least two fingers are in an alternating diode-rectifier arrangement with respect to one another, where at least one of the two fingers includes a p-type well with a first p-type diffusion region and a first n-type diffusion region, and where the first p-type region is staggered and divides the at least one of the two segments into the two portions associated with the at least one of the two fingers, where another one of the at least two fingers includes an n-type well with a second n-type diffusion region and a second p-type diffusion region, and where the second n-type region is staggered and divides the at least one of the two segments into the two portions associated with the at least one of the two fingers.

Yet another embodiment includes semiconductor electrostatic discharge protection device. The semiconductor electrostatic discharge protection device can include: a plurality of semiconductor controlled rectifiers, and a plurality of diodes, where the plurality of semiconductor rectifiers and the plurality of diodes are integrally arranged into at least three fingers, where each finger includes at least three segments along a surface of a semiconductor surface, where each of the at least three segments and each of the at least three fingers are in an alternating diode-rectifier arrangement with respect to one another.

Yet another embodiment includes semiconductor electrostatic discharge protection device. The semiconductor electrostatic discharge protection device can include: a plurality of semiconductor controlled rectifiers, and a plurality of diodes, where the plurality of semiconductor rectifiers and the plurality of diodes are integrally arranged into at least three fingers, where each finger includes at least three segments along a surface of a semiconductor surface, where each of the at least three segments and each of the at least three fingers are in an alternating diode-rectifier arrangement with respect to one another, where at least one of the plurality of diodes of is a p-n diode.

Yet another embodiment includes semiconductor electrostatic discharge protection device. The semiconductor electrostatic discharge protection device can include: a plurality of semiconductor controlled rectifiers, and a plurality of diodes, where the plurality of semiconductor rectifiers and the plurality of diodes are integrally arranged into at least three fingers, where each finger includes at least three segments along a surface of a semiconductor surface, where each of the at least three segments and each of the at least three fingers are in an alternating diode-rectifier arrangement with respect to one another, where at least one of the three fingers includes a p-type well with a first p-type diffusion, a second p-type diffusion region, a third p-type diffusion region, a first n-type diffusion region, a second n-type diffusion region, and third n-type diffusion region.

Yet another embodiment includes semiconductor electrostatic discharge protection device. The semiconductor electrostatic discharge protection device can include: a plurality of semiconductor controlled rectifiers, and a plurality of diodes, where the plurality of semiconductor rectifiers and the plurality of diodes are integrally arranged into at least three fingers, where each finger includes at least three segments along a surface of a semiconductor surface, where each of the at least three segments and each of the at least three fingers are in an alternating diode-rectifier arrangement with respect to one another, where at least one of the three fingers includes a p-type well with a first p-type diffusion, a second p-type diffusion region, a third p-type diffusion region, a first n-type diffusion region, a second n-type diffusion region, and third n-type diffusion region, where another one of the at least one of the three fingers includes an n-type well with a fourth t p-type diffusion, a fifth p-type diffusion region, a sixth p-type diffusion region, a fourth n-type diffusion region, a fourth n-type diffusion region, and sixth n-type diffusion region.

Yet another embodiment includes semiconductor electrostatic discharge protection device. The semiconductor electrostatic discharge protection device can include: a plurality of semiconductor controlled rectifiers, and a plurality of diodes, where the plurality of semiconductor rectifiers and the plurality of diodes are integrally arranged into at least three fingers, where each finger includes at least three segments along a surface of a semiconductor surface, where each of the at least three segments and each of the at least three fingers are in an alternating diode-rectifier arrangement with respect to one another, where at least one of the three fingers includes a p-type well with a first p-type diffusion, a second p-type diffusion region, a third p-type diffusion region, a first n-type diffusion region, a second n-type diffusion region, and third n-type diffusion region, where another one of the at least one of the three fingers includes an n-type well with a fourth t p-type diffusion, a fifth p-type diffusion region, a sixth p-type diffusion region, a fourth n-type diffusion region, a fourth n-type diffusion region, and sixth n-type diffusion region, where each p-type diffusion region is alternating with respect to each of n-type diffusion region with respect to each of the at least three fingers.

Yet another embodiment of the present disclosure includes a method for making or arranging a semiconductor device. The method includes: providing a semiconductor substrate, and laterally arranging a plurality of semiconductor fingers along a semiconductor substrate such that at least four of the plurality of semiconductor fingers form a silicon-controlled rectifier and at least two of the at least four of the plurality of semiconductor fingers form a diode, where each one of the at least four of the plurality of semiconductor fingers has an alternating n-diffusion and p-diffusion arrangement.

BRIEF DESCRIPTION OF THE DRAWINGS

FIG. 3 shows a top-down view of a semiconductor device according to at least one embodiment of the present disclosure.

DESCRIPTION OF EMBODIMENTS

Figure 1:
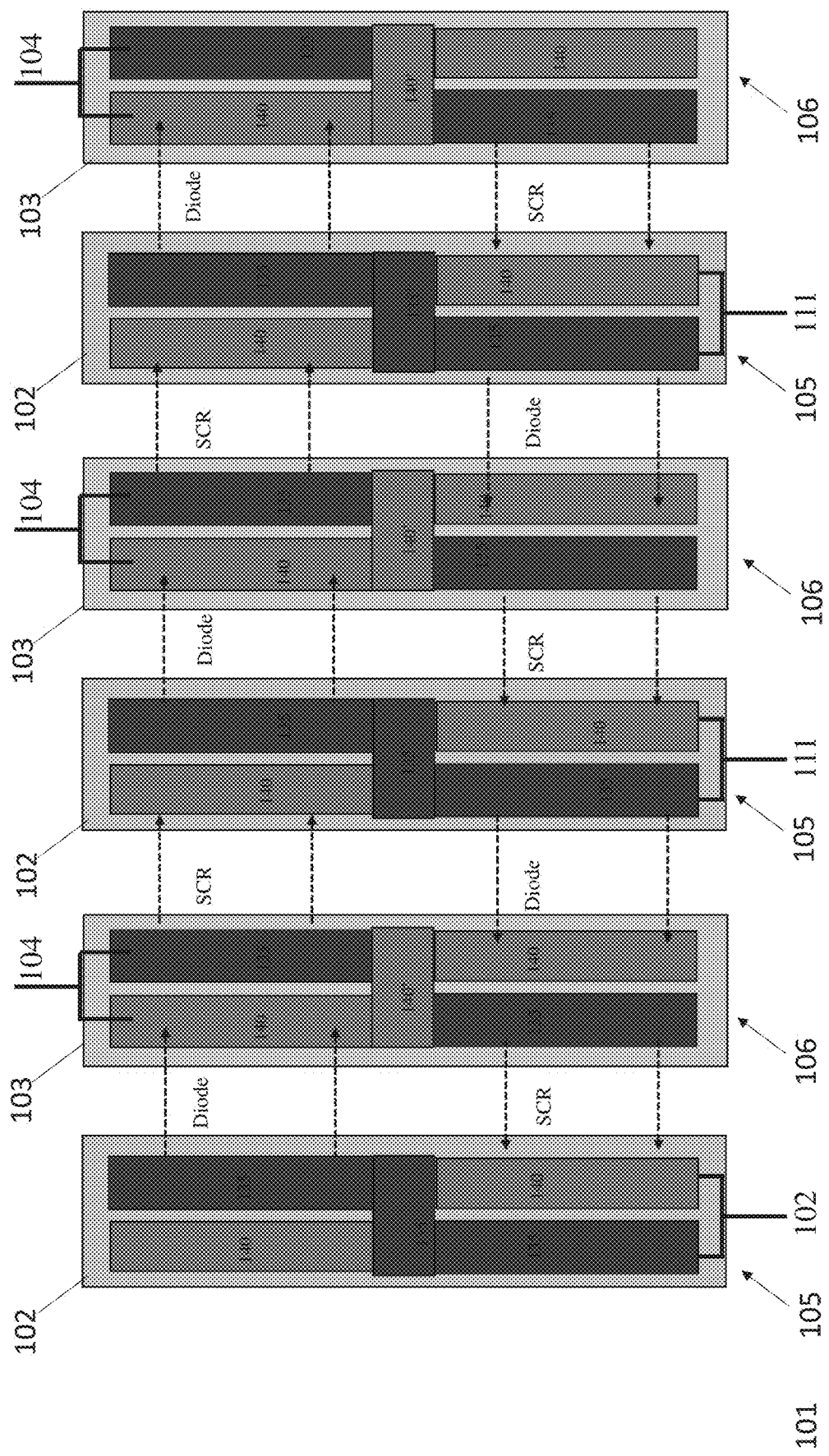
FIG. 1 shows a top-down view of a semiconductor device according to at least one embodiment of the present disclosure.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

One or more embodiments of the present disclosure are directed to at least one Silicon Controlled Rectifier (SCR) with at least one integrated diode in association therewith. In various embodiments, the at least one SCR and diode are laterally arranged along a semiconductor substrate. In various embodiments, the diode can be a p-n diode. In various embodiments, the SCR and diode arrangement can be used for ESD protection and can be arranged laterally out in finger configuration to optimize current distribution, and in various embodiments alternating and/or staggered SCR and diode segments can be associated with each finger. In various embodiments, this permits alternating current paths for SCR and diode under an ESD or surge event, and in various embodiments this can increase the device density by providing for more than one diode and/or SCR in relation to two or more fingers. In various embodiments, by setting the length of each device segments appropriately, it is also possible to increase the triggering current of the SCR by providing alternative current paths in relation to p-well regions, n-well regions, p-diffusion regions and/or n-diffusion regions associated with the SCR, which can be advantageous for certain applications where a high triggering current is desired.

FIG. 1 illustrates a top-down view of an ESD protection device 100 in accordance with at least one embodiment of the present disclosure. In various embodiments, the ESD protection device 100 can include a signal terminal 104 and a ground terminal 111. In various embodiments, the ESD protection device can include one or more fingers 105, 106. The one or more fingers 105 can include a p-well region (pw) 102 with one or more p-diffusion regions 135 and one or more n-diffusion regions 140. In various embodiments, the ESD device can 100 also include at least one p-diffusion segment 135' that divides an individual finger 105 into two or more segments, where in various embodiments the division is such that the an alternating and/or staggered arrangement is present between the n-diffusion regions 140 and p-diffusion regions 135 of the one or more fingers 105. In various embodiments, the ESD device 100 includes one or more fingers 106 that can include an n-well region (nw) 103 with one or more n-diffusion regions 140 and one or more p-diffusion regions 135. The one or more fingers 106 can include an n-diffusion segment 140' that divides each individual finger 106 into two or more segments, where the division is such that the p-diffusion regions 135 and the n-diffusion regions 140 of the one or more fingers 106 are in a staggered and/or alternating arrangement.

In various embodiments, the one or more fingers 105 and the one or more fingers 106 are arranged laterally on any suitable semiconductor substrate 101, and in various embodiments, the division into segments of the individual fingers results in an alternating and/or staggered arrangement of the p-diffusion regions 135 of one finger 105 in relation to n-diffusion regions 140 of another finger 106. The substrate can be n-doped and/or p-doped at various portions as required and depending on the configuration of a particular finger 105, 106 along the substrate 101, where the substrate 101 can be doped with a different type and/or with a different concentration of dopant at various parts along the substrate.

In various embodiments, the ESD device 100 can be regarded as an arrangement of one or more p-n-p transistors connected to one or more n-p-n transistors forming one or more SCRs and one or more p-n diodes. In various embodiments, two or more fingers 105, 106 are divided such that at least p-n-p and n-p-n transistors are formed by the arrangement on substrate 101. In various embodiments, a collector of at least one p-n-p transistor can be connected to a base of at least one n-p-n transistor, and a base of at least one p-n-p transistor may be connected to a collector of at least one n-p-n transistor. In this way, and pursuant to various embodiments, the ESD 100 protection device can be considered to include one or more SCRs and one or more diodes. In various embodiments, one or more emitters of at least one n-p-n transistor can form the ground terminal 111 of the ESD protection device 100 and one or more emitters of at least one p-n-p transistor can form the signal terminal 104 of the ESD protection device 100. In various embodiments one or more p-n diodes, also known as a back-diode in various embodiments, can be connected across the signal terminal 104 and/or the ground terminal 111.

According to various embodiments of in relation to FIG. 1, the ESD device 100 an can be considered to include four fingers 105, 106, 105, and 106 of four laterally arranged layers of alternating n and p type semiconductor materials to form an p-n-p-n structure, where in various embodiments, each finger 105, 106, 105, and 106 provides at least two SCR segments, resulting in at least two SCRs being formed laterally across device 100. In various embodiments, an emitter of at least one p-n-p transistor can be formed by the p+ type diffusion region 135 of a finger, a base of at least one of the p-n-p transistor can be formed by the nw 103 of at least one finger, and a collector of at least one p-n-p transistor can be formed by the pw 102 and the p+ diffusion region 135 of at least one finger. In various embodiments, the base of at least one p-n-p transistor is contacted via the n+ diffusion region 140 of at least one finger. In various embodiments, an emitter of at least one n-p-n transistor can be formed by the n+ diffusion region 140 of at least one finger, a base of at least one n-p-n transistor can be formed in part by the pw region 102 of at least one finger. A collector of the n-p-n transistor can be formed by the nw 103 and the n+ type diffusion region 140 of at least one finger.

In various embodiments, a p-n diode of the ESD device 100 can be formed by the p+ type diffusion region 135 formed in the pw 102 of at least one finger, which may form an anode of the p-n diode, and a n+ type diffusion region 140 formed in the n type well region (nw) 103 of at least one finger, which may form an cathode of the p-n diode. In this way, and pursuant to various embodiments, a p-n diode may be integrally formed with SCR 110 in the substrate 101. In various embodiments, a p+ diffusion region 135 of at least one finger may serve both as base contact for the n-p-n transistor and as an anode of the p-n diode. In various embodiments, a p+ diffusion region 135 formed in the pw 102 of at least one region can be connected to n+ diffusion region 140, to form a ground terminal 111 of the ESD device 100. In various embodiments, n+ diffusion region 140 of at least one finger can serve both as base contact for a p-n-p transistor and as cathode of a p-n diode. In various embodiments, n+ diffusion region 140 formed in the n-type well region 103 of at least one finger can be connected to p+ diffusion region 135 of at least one finger, forming signal terminal 104 of the ESD device 100.

In various embodiments, an SCR of ESD 100 may be activated by a positive stress voltage, which may be caused by an ESD event, with respect to the ground terminal 111, on the signal terminal 104. Current may flow from p+ diffusion region 135 of at least one finger 106 to n+ diffusion region 140 of at least one finger 105. In this way the excessive current on terminal 104 may be drained to ground and the voltage on the signal terminal 104 may be limited in that way protecting any external device that is connected to terminal 104 from overvoltage and overcurrent caused by the positive ESD event. In this context, voltage is limited to the clamping voltage of the ESD protection device 100. The clamping voltage may be considered as the sum of the snap-back voltage, as opposed to the breakdown voltage, of the SCR and the voltage drop caused by the current flowing through the device and the on-resistance of the device. The clamping voltage may be chosen such that it is lower than the critical voltage that would damage the system to be protected.

In various embodiments, for a negative stress voltage, which may be caused by an ESD event on the signal terminal 104, with respect to the ground terminal 111, the ESD device 100 operates as a p-n diode between the p+ diffusion region 135 of at least one finger formed in the pw 102, and the n+ diffusion region 140 formed in the nw region of at least one finger. Current may flow from p+ diffusion region 135 of at least one finger to n+ diffusion region 140 of at least one finger. In that way, and pursuant to various embodiments, the excessive current from the ESD event on terminal 104 may be drained to ground 111 and the voltage on terminal 104 is limited, in that way protecting any external device that is connected to terminal 104 from overvoltage and overcurrent caused by the negative ESD event.

Figure 2:
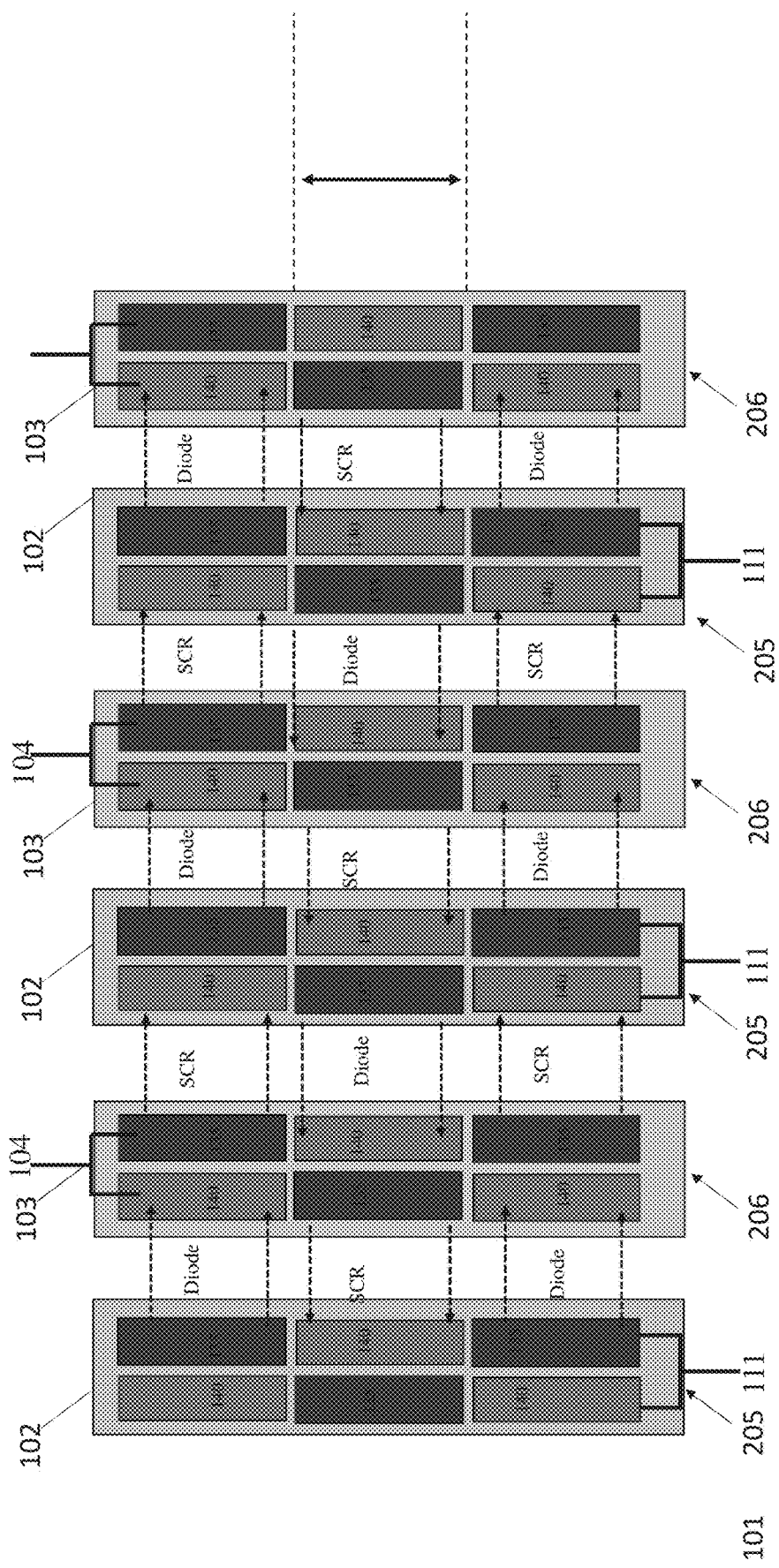
FIG. 2 shows a top-down view of a semiconductor device according to at least one embodiment of the present disclosure.

FIG. 2 illustrates an embodiment of an ESD device 200 according to at least one embodiment of the present disclosure. The ESD device 200 operates substantially similar to device 100, except that it each finger 105, 106 is divided into at least three segments, and in various embodiments, a segment 135' and 140' is omitted to accomplish the division. In various embodiments, the ESD protection device 200 can include a signal terminal 104 and a ground terminal 111. In various embodiments, the ESD protection device can include one or more fingers 205, 206. The one or more fingers 205 can include a p-well region (pw) 102 with one or more p-diffusion regions 135 and one or more n-diffusion regions 140. In various embodiments, the division of one or more fingers 205 is such that alternating p-diffusion regions 135 and n-diffusion regions 140 divide the one or more fingers 105 into three or more segments. In various embodiments the division is such that an alternating arrangement is present between the n-diffusion regions 140 and p-diffusion regions 135 of one or more fingers 205. In various embodiments, the ESD device 200 includes one or more fingers 206 that can include an n-well region (nw) 103 with one or more n-diffusion regions 140 and one or more p-diffusion regions 135. In various embodiments, the division of one or more fingers 206 is such that alternating p-diffusion regions 135 and n-diffusion regions 140 divide the one or more fingers 106 into three segments.

In various embodiments the division is such that an alternating arrangement is present between the n-diffusion regions 140 and p-diffusion regions 135. In various embodiments, the one or more fingers 205 and the one or more fingers 206 are arranged laterally on any suitable semiconductor substrate 101, and in various embodiments, the division into segments of the individual fingers results in an alternating and/or staggered arrangement of the p-diffusion regions 135 of one finger 205 in relation to n-diffusion regions 140 of another finger 206. The substrate can be n-doped and/or p-doped at various portions as required and depending on the configuration of a particular finger 205, 206 along the substrate 101, where the substrate 101 can be doped with a different type and/or with a different concentration of dopant at various parts along the substrate.

As with ESD 100, ESD 200 utilizes one or more fingers 205, 206 to form one or more SCRs and diodes, except that as shown, each finger is divided into three segments, which each segment forming at least part of at least one SCR and/or diode.

FIG. 3 illustrates a method 300 for making and/or arranging a semiconductor electrostatic discharge protection device according to at least one embodiment of the present disclosure. The method includes providing a suitable semiconductor substrate 302. The semiconductor substrate 302 can be doped with any suitable dopant and with a different dopant and/or with different concentration as is suitable for the particular purpose for its use. The method can further include forming or arranging a plurality of fingers, including four or more fingers, on the semiconductor substrate to form a device as disclosed herein 310. The four or more fingers can be formed by any suitable series of semiconductor processing steps, including performing one or more etching (e.g. wet etch, reactive ion etching, etc.), doping (utilizing any suitable dopant technique with p-dopants and/or n-dopants on the substrate and/or other layers as suitable), and/or depositing (chemical-vapor deposition, physical vapor deposition, etc.) one or more semiconductor material layers on the substrate to form one or more devices as disclosed herein. In various embodiments, the four or more fingers will form at least one SCR device and two of the four or more fingers can form at least one diode. In various embodiments the four or more fingers are divided into at least two segments with alternating n-diffusion and p-diffusion layers, such that two or more SCRs and two or more diodes can be formed, with each finger containing two segments and each segment being associated with a portion of an SCR and/or diode.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:

1. A semiconductor electrostatic discharge protection device, comprising:
    a plurality of semiconductor controlled rectifiers; and
    a plurality of diodes,
    wherein a first semiconductor controlled rectifier of the plurality of semiconductor rectifiers and a first diode of the plurality of diodes are integrally formed between a first finger and a second finger that are arranged laterally along a surface of a semiconductor substrate, wherein each finger of the first finger and the second finger includes at least two segments,
    wherein the first finger is arranged in a first configuration that comprises:
        a first segment, comprising a first n-type diffusion region, and a first p-type diffusion region,
        a second segment, comprising a second n-type diffusion region, and a second p-type diffusion region;
        a p-type well; and
        a p-type diffusion region that separates the first segment from the second segment, and forms an n-p-n transistor, and
    wherein the second finger is arranged in a second configuration that comprises:
        a first segment, comprising a first n-type diffusion region and a first p-type diffusion region;
        a second segment, comprising a second n-type diffusion region and a second p-type diffusion region;
        an n-type well; and
        an n-type diffusion region that separates the first segment from the second segment, and forms a p-n-p transistor.

2. The semiconductor electrostatic discharge protection device of claim 1, further comprising:
a third finger, arranged laterally adjacent to the second finger, the third finger comprising the first configuration; and
a fourth finger, arranged laterally adjacent to the third finger, the fourth finger comprising the second configuration.

3. The semiconductor electrostatic discharge protection device of claim 1, wherein at least one of the plurality of diodes of is a p-n diode.

4. The semiconductor electrostatic discharge protection device of claim 2, wherein a first diode of the plurality of diodes is formed between the first p-type diffusion region of the first finger and the first n-type diffusion region of the second finger, and wherein a first semiconductor controlled rectifier of the plurality of semiconductor controlled rectifiers is formed between the second n-type diffusion region of the first finger and the second p-type diffusion region of the second finger.

5. The semiconductor electrostatic discharge protection device of claim 4, wherein a second diode of the plurality of diodes is formed between the second n-type diffusion region of the second finger and a second p-type diffusion region of the third finger, and wherein a second semiconductor controlled rectifier of the plurality of semiconductor controlled rectifiers is formed between the first p-type diffusion region of the second finger and a first n-type diffusion region of the third finger.

6. A semiconductor electrostatic discharge protection device, comprising:
a plurality of semiconductor controlled rectifiers; and
a plurality of diodes,
wherein a first semiconductor controlled rectifier of the plurality of semiconductor controlled rectifiers and a first diode and a second diode of the plurality of diodes are integrally formed between a first finger and a second finger that are arranged laterally along a surface of a semiconductor substrate,
wherein each finger of the first finger and the second finger comprises a first configuration that includes at least three segments, the at least three segments comprising:
a first segment, comprising a first n-type diffusion region, and a first p-type diffusion region,
a second segment, comprising a second n-type diffusion region, and a second p-type diffusion region; and
a third segment, comprising a third n-type diffusion region, and a third p-type diffusion region.

7. The semiconductor electrostatic discharge protection device of claim 6, wherein the first p-type diffusion region of the first finger and the first n-type diffusion region of the second finger form the first diode, wherein the second n-type diffusion region of the first finger and the second p-type diffusion region of the second finger form the first semiconductor controlled rectifier, and wherein the third p-type diffusion region of the first finger and the third n-type diffusion region of the second finger form the second diode a p-n diode.

8. The semiconductor electrostatic discharge protection device of claim 6, further comprising a third finger, comprising the first configuration and being arranged laterally with respect to the second finger, wherein at least one of the first finger, the second finger, and the third finger includes a p-type well.

9. The semiconductor electrostatic discharge protection device of claim 8, wherein another one of the at least one of the first finger, the second finger, and the third finger includes an n-type well.

10. The semiconductor electrostatic discharge protection device of claim 8,
wherein the first p-type diffusion region of the second finger and a first n-type diffusion region of the third finger form a second semiconductor controlled rectifier, wherein the second n-type diffusion region of the second finger and a second p-type diffusion region of the third finger form a third diode, and wherein the third p-type diffusion region of the second finger and a third n-type diffusion region of the third finger form a third semiconductor controlled rectifier.

* * * * *